United States Patent
Van Brunt et al.

(10) Patent No.: US 7,773,965 B1
(45) Date of Patent: Aug. 10, 2010

(54) CALIBRATED QUADRATURE VERY LOW INTERMEDIATE FREQUENCY RECEIVER

(75) Inventors: Roger W. Van Brunt, Santa Cruz, CA (US); Mark Alexander John Moffat, Mortimer (GB); Steve Picken, Santa Cruz, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 962 days.

(21) Appl. No.: 11/534,072

(22) Filed: Sep. 21, 2006

(51) Int. Cl.
*H04B 17/00* (2006.01)
*H04B 1/10* (2006.01)

(52) U.S. Cl. .................... 455/226.1; 455/285; 455/302; 455/304; 455/324

(58) Field of Classification Search ............. 455/226.1, 455/232.1, 234.1, 234.2, 285, 293, 302, 303, 455/304, 323, 324
See application file for complete search history.

(56) References Cited

U.S. PATENT DOCUMENTS 7,362,826 B2 * 4/2008 Willingham ................ 375/327

| | | | |
|---|---|---|---|
| 2003/0165203 A1 * | 9/2003 | Mohindra | 375/324 |
| 2004/0152436 A1 * | 8/2004 | Masenten et al. | 455/323 |
| 2005/0221781 A1 * | 10/2005 | Lin et al. | 455/296 |
| 2006/0035617 A1 * | 2/2006 | Kim | 455/323 |
| 2007/0099570 A1 * | 5/2007 | Gao et al. | 455/63.1 |

OTHER PUBLICATIONS

Terrovitis et al., "Intermodulation Distortion in Current-Commutating CMOS Mixers," IEEE Journal of Solid-State Circuits, Oct. 2000, pp. 1461-1473, vol. 35, No. 10, IEEE.

* cited by examiner

*Primary Examiner*—Nguyen Vo
(74) *Attorney, Agent, or Firm*—Withrow & Terranova, P.L.L.C.

(57) ABSTRACT

The present invention is a quadrature VLIF receiver, including calibration circuitry, and methods to closely match signal processing of an in-phase signal path and a quadrature-phase signal path to optimize VLIF image rejection. The calibration circuitry includes a variable gain variable-phase calibration signal generator, a variable gain amplifier for each signal path, phase adjustment circuitry for each signal path, and switching circuitry to support calibration steps. The calibration signal generator supplies a calibration signal at the same frequency as mixer local oscillator signals; therefore, during calibration, all signals downstream of the VLIF mixer are at DC, which simplifies calibration measurements, thereby minimizing calibration times.

7 Claims, 15 Drawing Sheets

CALIBRATED QUADRATURE VERY LOW INTERMEDIATE FREQUENCY RECEIVER

FIELD OF THE INVENTION

The present invention relates to radio frequency (RF) receiver circuits, which are used in wireless communications systems.

BACKGROUND OF THE INVENTION

With the growth of the wireless communications industry, wireless communications protocols become more sophisticated, often resulting in narrow channel bandwidths. As such, RF receivers must be capable of receiving RF signals on narrow channels with low noise and a high degree of selectivity. Wireless communications systems are often battery powered and must function with minimal power consumption.

A traditional RF receiver architecture is the heterodyne architecture in which a received RF signal is mixed with a local oscillator signal to obtain a lower intermediate frequency (IF) signal. The IF signal is then filtered to the desired channel bandwidth to remove interfering signals and signals from adjacent channels. As channel bandwidths become narrower, the inclination is to reduce the frequency of the IF signal. An extreme example is a direct-conversion receiver, which has a direct current (DC) IF signal; however, problems with 1/f noise, DC offsets, and second-order inter-modulation (IIP2) effects may eliminate the direct-conversion receiver from many applications. As a result, receivers using a very low intermediate frequency (VLIF) for their IF sections are becoming increasingly common.

One design challenge in a VLIF receiver is rejection of image frequencies. In any heterodyne receiver, when a received RF input signal $F_R$, mixes with a local oscillator signal $F_{LO}$, the mixer produces an output signal with sums and differences of $F_R$ and $F_{LO}$. If $F_{LO}$ is chosen with a lower frequency than a desired RF input signal $F_{DRF}$, then the $F_R$–$F_{LO}$ portion of the mixer output signal produces a desired VLIF signal $F_{DVLIF}$; however, the mixer output signal will also include the $F_R$+$F_{LO}$ portion of the mixer output signal from the desired RF input signal $F_{DRF}$, which produces a frequency equal to ($2*F_{DRF}$–$F_{DVLIF}$). Any received RF signals in this frequency range would be easily filtered out by IF bandpass circuitry. A blocking image frequency is located at the frequency of $F_{LO}$–$F_{DVLIF}$; therefore, a received blocking image signal at the blocking image frequency would produce a mixer output signal with the $F_R$–$F_{LO}$ portion of the mixer output signal identical in frequency to the frequency of $F_{DVLIF}$, but with the quadrature phase-shifted 180 degrees. Complex filtering can then be used to remove the blocking image signal. The $F_{LO}$+$F_R$ portion of the mixer output signal produces a frequency equal to ($2*F_{DRF}$+$F_{DVLIF}$), which is easily filtered out by IF bandpass circuitry. In some applications, the blocking image signal may be at least 41 decibels (db) higher than the desired RF input signal $F_{DRF}$.

For example, if the frequency of $F_{LO}$=10 Mhz and the frequency of $F_{DRF}$=10.1 Mhz, then the frequency of $F_{DVLIF}$=100 Khz and the blocking image frequency would equal 9.9 Mhz. Any received signals at 9.9 Mhz would be mixed to the same frequency as $F_{DVLIF}$, namely 100 Khz. Since 9.9 Mhz is relatively close to 10.1 Mhz, the second image frequency cannot be easily filtered out in the RF section; therefore, the VLIF section must somehow eliminate the second image frequency.

A quadrature VLIF receiver 10 can virtually eliminate the blocking image signal, as shown in FIG. 1. A receiver input signal $RF_{IN}$ feeds a first passive RF bandpass filter 12, which then feeds a low noise RF amplifier (LNA) 14. The LNA 14 then feeds a second passive RF bandpass filter 16, which feeds a quadrature VLIF mixer 18. The quadrature VLIF receiver 10 may be integrated into an integrated circuit (IC). The first passive RF bandpass filter 12 may be external to the IC, and may include a surface acoustic wave (SAW) filter. The second passive RF bandpass filter 16 may be included in the IC, and may include an inductor and capacitor tank circuit. The quadrature VLIF mixer 18 receives an in-phase local oscillator signal $I_{RF}$ and a quadrature-phase local oscillator signal $Q_{RF}$ from a quadrature frequency synthesizer 20. $I_{RF}$ is identical in frequency and amplitude to $Q_{RF}$; however, $I_{RF}$ is phase-shifted from $Q_{RF}$ by essentially 90 degrees. The quadrature VLIF mixer 18 creates an in-phase VLIF signal $I_{VLIF}$ and a quadrature-phase VLIF signal $Q_{VLIF}$ that feed quadrature VLIF bandpass and analog-to-digital (A/D) conversion circuitry 22, which filters and converts the analog VLIF quadrature signals into in-phase digital VLIF data $I_{DIGITAL}$ and quadrature-phase digital VLIF data $Q_{DIGITAL}$. The quadrature VLIF bandpass and A/D conversion circuitry 22 may include complex polyphase bandpass circuitry.

By using a quadrature architecture when receiving the desired RF input signal $F_{DRF}$, the $F_R$–$F_{LO}$ portion of the mixer output signal produces the desired VLIF signal $F_{DVLIF}$, or $F_{DRF}$=$F_{LO}$+$F_{DVLIF}$; however, the image blocking signal at $F_{LO}$–$F_{DVLIF}$ will also be down converted but to a negative VLIF frequency. The difference between the negative VLIF frequency of the image blocking signal and the positive VLIF frequency of the desired VLIF signal $F_{DVLIF}$ is in the phase relationships of the quadrature VLIF signals $I_{VLIF}$, $Q_{VLIF}$. One of the received signals will produce quadrature VLIF signals $I_{VLIF}$, $Q_{VLIF}$ in which $I_{VLIF}$ leads $Q_{VLIF}$ by essentially 90 degrees. The other of the received signals will produce quadrature VLIF signals $I_{VLIF}$, $Q_{VLIF}$ in which $I_{VLIF}$ lags $Q_{VLIF}$ by essentially 90 degrees. This lead/lag difference in quadrature allows complex polyphase filters to filter out one received signal and amplify the other received signal, thereby rejecting the image blocking signal and amplifying the desired RF input signal $F_{DRF}$. Any mismatch between the processing of in-phase signals and quadrature-phase signals will result in degradation of the rejection of second image signals; therefore, a need exists for a quadrature VLIF receiver with close matching between the circuitry processing the in-phase signals and the quadrature-phase signals. Such a receiver needs to be low-powered and low noise.

SUMMARY OF THE INVENTION

The present invention is a quadrature VLIF receiver, including calibration circuitry, and methods to closely match signal processing of an in-phase signal path and a quadrature-phase signal path to optimize VLIF image rejection. The calibration circuitry includes a variable gain variable-phase calibration signal generator, a variable gain amplifier for each signal path, phase adjustment circuitry for each signal path, and switching circuitry to support calibration steps. The calibration signal generator supplies a calibration signal at the same frequency as mixer local oscillator signals; therefore, during calibration, all signals downstream of the VLIF mixer are at DC, which simplifies calibration measurements, thereby minimizing calibration times. Since the downstream calibration signals are at DC, the calibration measurements are amplitude measurements only without any phase measurements. In one embodiment of the present invention, the calibration signal and the mixer local oscillator signals are provided from a common frequency synthesizer. Therefore, synthesizer phase noise is cancelled out during calibration.

The present invention is designed for low power applications, including cell phone applications, and may be used in the personal communications services (PCS) band (1930 to 1990 Mhz), the digital cellular system (DCS) band (1805 to 1880 Mhz), the global system for mobile communications (GSM) band (869 to 894 Mhz), and the extended GSM (EGSM) band (925 to 960 Mhz).

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is a quadrature VLIF receiver, including calibration circuitry, and methods to closely match signal processing of an in-phase signal path and a quadrature-phase signal path to optimize VLIF image rejection. The calibration circuitry includes a variable gain variable-phase calibration signal generator, a variable gain amplifier for each signal path, phase adjustment circuitry for each signal path, and switching circuitry to support calibration steps. The calibration signal generator supplies a calibration signal at the same frequency as mixer local oscillator signals; therefore, during calibration, all signals downstream of the VLIF mixer are at DC, which simplifies calibration measurements.

Since the downstream calibration signals are at DC, the calibration measurements are amplitude measurements only without any phase measurements. Therefore, the calibration circuitry responds quickly to calibration signals, thereby minimizing calibration times. In one embodiment of the present invention, a power up calibration is performed at power up to perform an initial calibration; however, since calibration times have been minimized, an update calibration is performed on each channel just before a communications exchange on that channel. In one embodiment of the present invention, the calibration signal and the mixer local oscillator signals are provided from a common frequency synthesizer. Therefore, synthesizer phase noise is cancelled out during calibration.

The present invention is designed for low power applications, including cell phone applications, and may be used in the personal communications services (PCS) band (1930 to 1990 Mhz), the digital cellular system (DCS) band (1805 to 1880 Mhz), the global system for mobile communications (GSM) band (869 to 894 Mhz), and the extended GSM (EGSM) band (925 to 960 Mhz).

Figure 1:
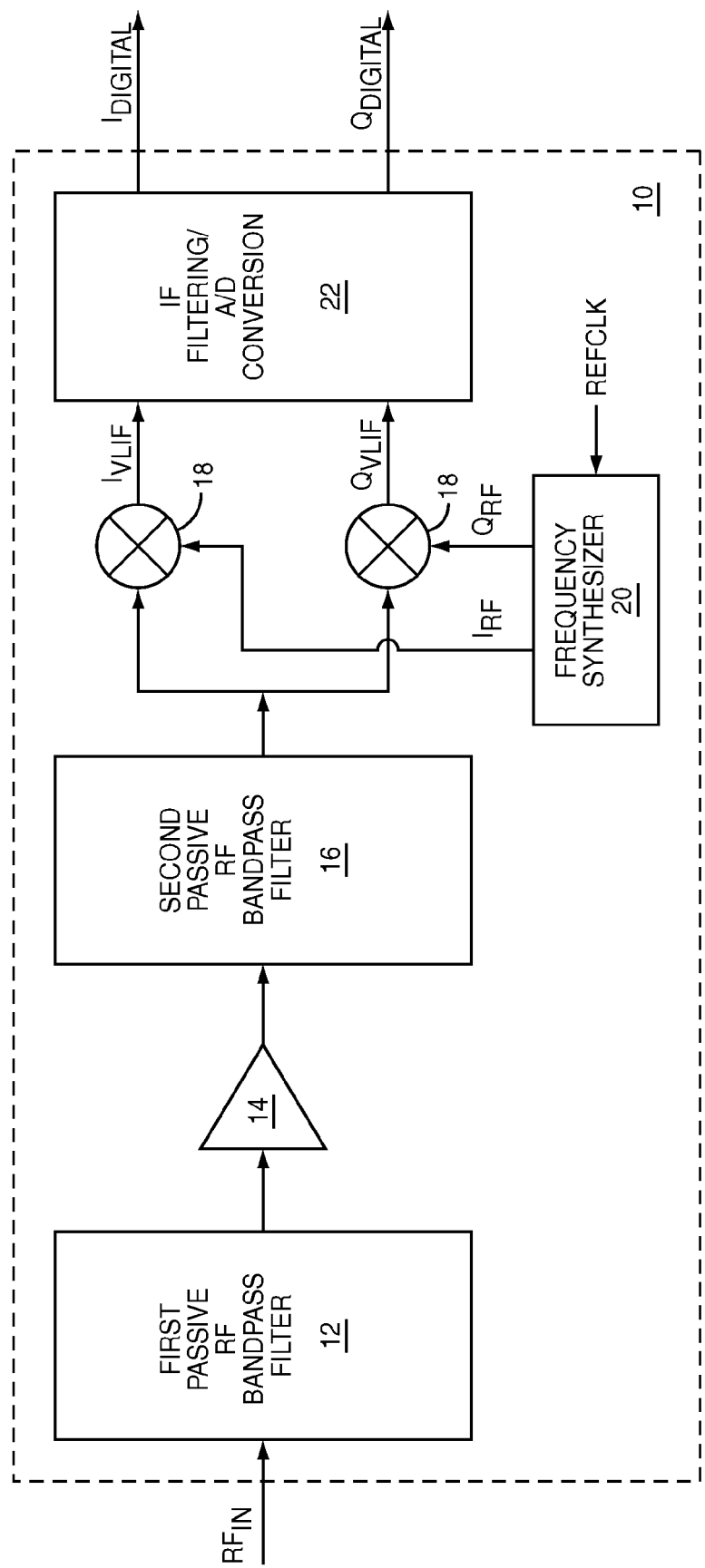
FIG. 1 shows an example of one embodiment of a quadrature VLIF receiver according to the prior art.
Figure 2:
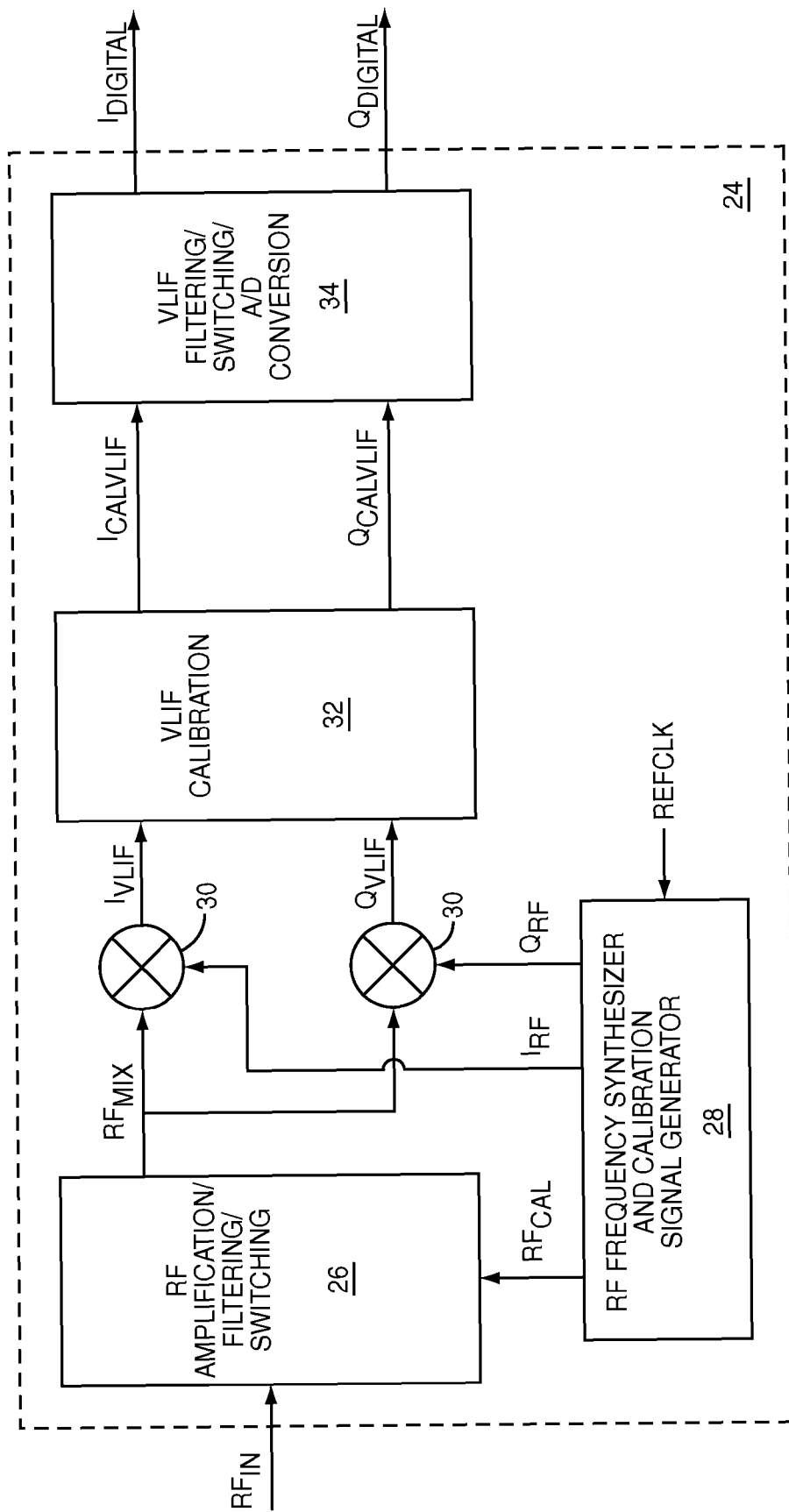
FIG. 2 shows the present invention, which is a calibrated quadrature VLIF receiver.

One embodiment of the present invention is a calibrated quadrature VLIF receiver 24 as shown in FIG. 2. An RF input signal $RF_{IN}$ feeds RF amplification, filtering, and switching circuitry 26, which receives an RF calibration signal $RF_{CAL}$ from an RF frequency synthesizer and calibration signal generator 28. The RF amplification, filtering, and switching circuitry 26 may provide amplification, filtering, or both, for the RF signals $RF_{IN}$, $RF_{CAL}$, or both, and then select either $RF_{IN}$ or $RF_{CAL}$ to provide an RF output $RF_{MIX}$ feeding a calibrated quadrature VLIF mixer 30. The calibrated quadrature VLIF mixer 30 receives an in-phase local oscillator signal $I_{RF}$ and a quadrature-phase local oscillator signal $Q_{RF}$ from the RF frequency synthesizer and calibration signal generator 28. The calibrated quadrature VLIF mixer 30 includes an in-phase mixer, which multiplies $RF_{MIX}$ and $I_{RF}$ to create an in-phase VLIF signal $I_{VLIF}$, and a quadrature-phase mixer, which multiplies $RF_{MIX}$ and $Q_{RF}$ to create a quadrature-phase VLIF signal $Q_{VLIF}$. The RF frequency synthesizer and calibration signal generator 28 uses an input reference clock REFCLK to generate $RF_{CAL}$, $I_{RF}$, and $Q_{RF}$, which are all at the same frequency. $I_{RF}$ is phase-shifted from $Q_{RF}$ by essentially 90 degrees.

When $RF_{MIX}$ is derived from $RF_{CAL}$, as during calibration, $I_{VLIF}$ and $Q_{VLIF}$ are DC signals used for calibration. When $RF_{MIX}$ is derived from $RF_{IN}$, as during normal operation, $I_{VLIF}$ and $Q_{VLIF}$ are VLIF signals. The present invention relies on a correlation between DC signals during calibration and VLIF signals during normal operation. In one embodiment of the present invention, when receiving a desired RF signal during normal operation, the frequency of $I_{VLIF}$ and $Q_{VLIF}$ may be essentially 175 Khz.

Quadrature VLIF calibration circuitry 32 receives $I_{VLIF}$ and $Q_{VLIF}$, and may apply amplitude calibration adjustments, phase calibration adjustments, or both, to the VLIF signals $I_{VLIF}$, $Q_{VLIF}$, or both, to create a calibrated in-phase VLIF signal $I_{CALVLIF}$ and a calibrated quadrature-phase VLIF signal $Q_{CALVLIF}$. $I_{CALVLIF}$ and $Q_{CALVLIF}$ feed calibrated quadrature VLIF filtering, switching, and ND converter circuitry 34, which may filter $I_{CALVLIF}$, $Q_{CALVLIF}$, or both, and then route either $I_{CALVLIF}$ or $Q_{CALVLIF}$ to N D conversion circuitry to convert analog VLIF quadrature signals into in-phase digital VLIF data $I_{DIGITAL}$ and quadrature-phase digital VLIF data $Q_{DIGITAL}$. $I_{DIGITAL}$ and $Q_{DIGITAL}$ are fed to other digital circuitry for calibration processing, de-modulation, and data extraction (not shown).

Figure 3:
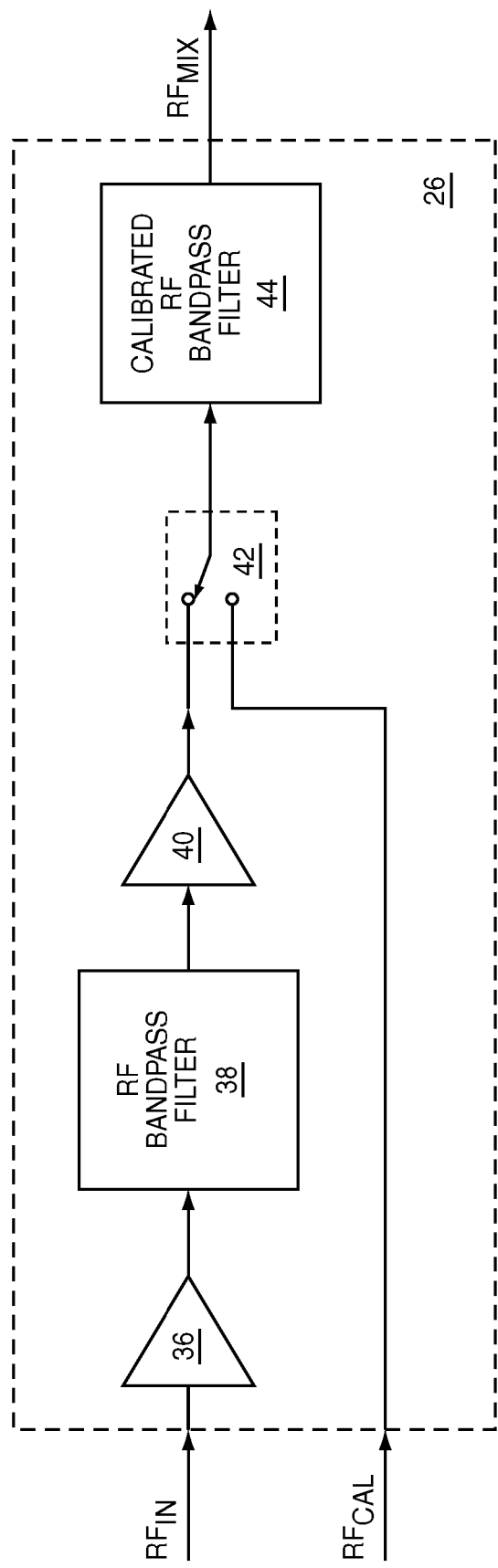
FIG. 3 shows details of the RF amplification, filtering, and switching circuitry of FIG. 2 in a first embodiment of the present invention.

In a first embodiment of the present invention, the RF amplification, filtering, and switching circuitry 26 is designed for a single communications band, as shown in FIG. 3. An LNA 36 receives $RF_{IN}$ and feeds an RF bandpass filter 38, which then feeds an RF mixer preamplifier 40. A first RF switch 42 receives the output from the RF mixer preamplifier 40 and also receives $RF_{CAL}$, and then selects one of the two to provide a signal to a calibrated RF bandpass filter 44, which then provides $RF_{MIX}$. During calibration, the first RF switch 42 selects $RF_{CAL}$. During normal operation, the first RF switch 42 selects the output from the RF mixer preamplifier.

Figure 4:
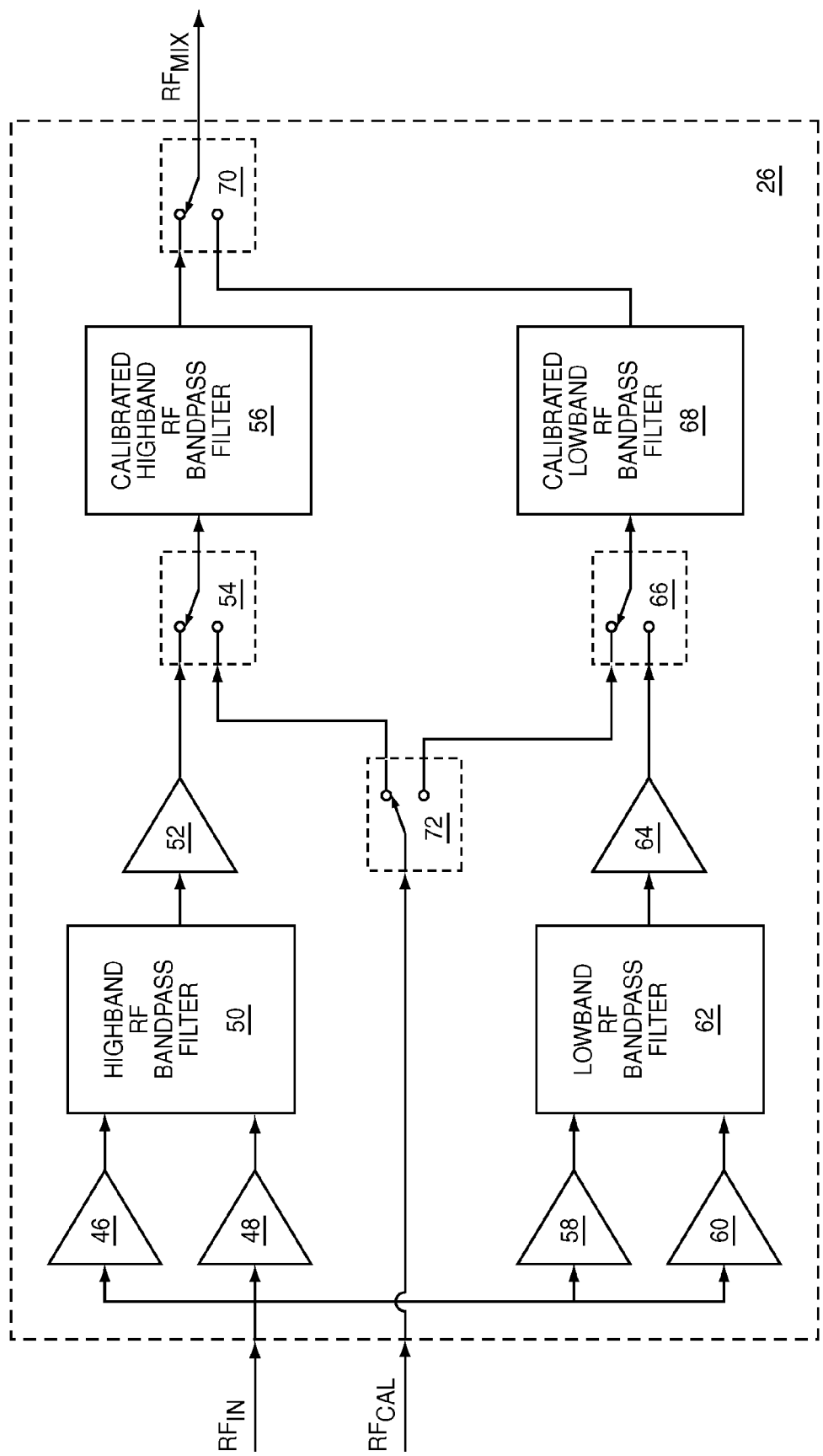
FIG. 4 shows details of the RF amplification, filtering, and switching circuitry of FIG. 2 in a second embodiment of the present invention.

In a second embodiment of the present invention, the RF amplification, filtering, and switching circuitry 26 is designed for four communications bands, as shown in FIG. 4, which may include the PCS band, the DCS band, the GSM band, and the EGSM band. A PCS band LNA 46 and a DCS band LNA 48 receive $RF_{IN}$ and feed a highband RF bandpass filter 50, which then feeds a highband RF mixer preamplifier 52. A second RF switch 54 receives the output from the highband RF mixer preamplifier 52 and feeds a calibrated highband RF bandpass filter 56. An EGSM band LNA 58 and a GSM band LNA 60 receive $RF_{IN}$ and feed a lowband RF bandpass filter 62, which then feeds a lowband RF mixer preamplifier 64. A third RF switch 66 receives the output from the lowband RF mixer preamplifier 64 and feeds a calibrated lowband RF bandpass filter 68. The calibrated highband RF bandpass filter 56 and the calibrated lowband RF bandpass filter 68 feed a fourth RF switch 70, which provides $RF_{MIX}$. A fifth RF switch 72 receives $RF_{CAL}$ and feeds both the second RF switch 54 and the third RF switch 66.

The second RF switch 54 selects input signals from either the highband RF mixer preamplifier 52 or the fifth RF switch 72 for either calibration or normal operation. The third RF switch 66 selects input signals from either the lowband RF mixer preamplifier 64 or the fifth RF switch 72 for either calibration or normal operation. The fourth RF switch 70 selects input signals from one of the RF bandpass filters 56, 68 for either highband or lowband signals during both calibration and normal operations.

Figure 5:
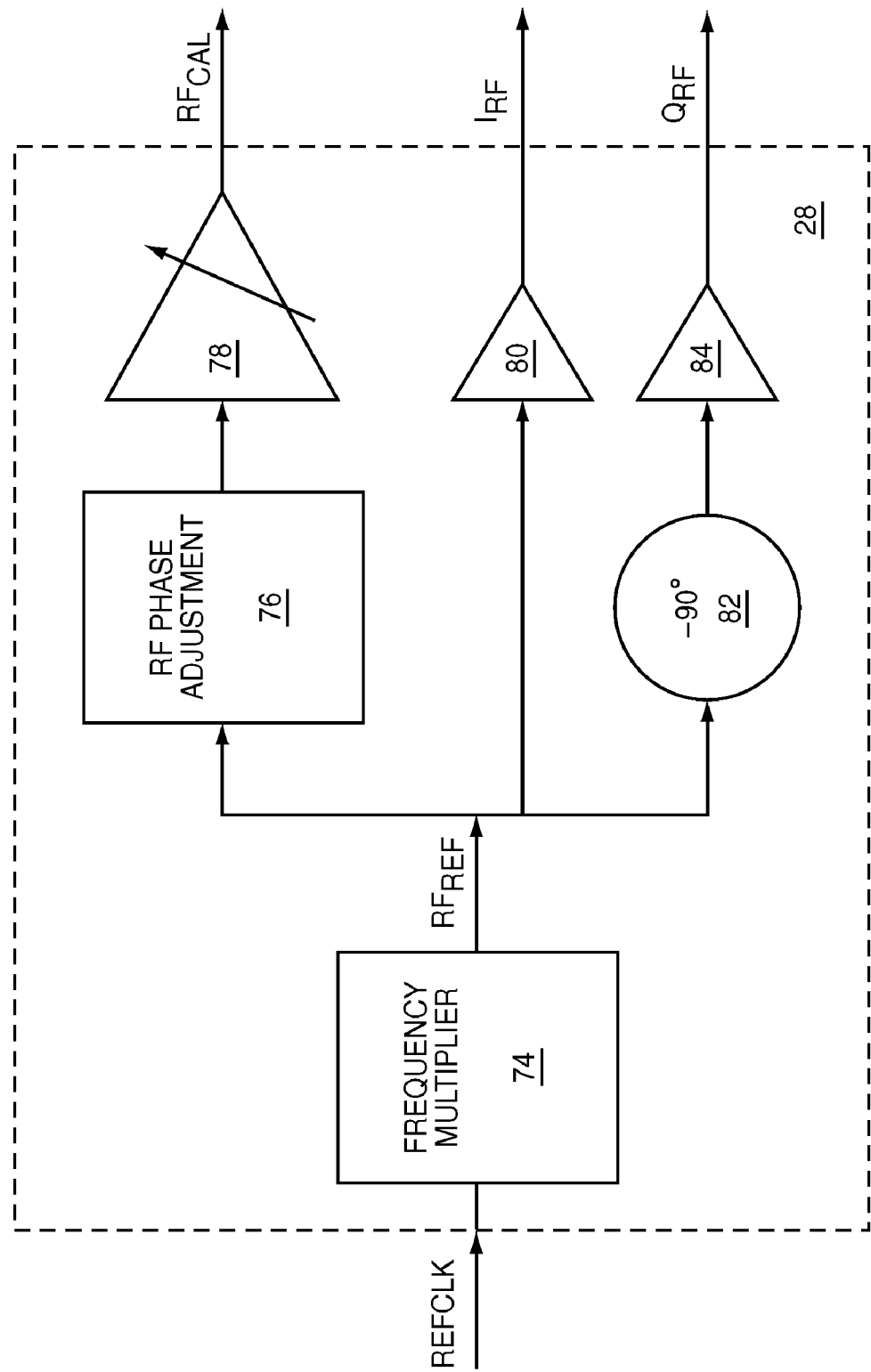
FIG. 5 shows details of the RF frequency synthesizer and calibration signal generator of FIG. 2 in one embodiment of the present invention.

Details of the RF frequency synthesizer and calibration signal generator 28 are shown in FIG. 5. A frequency multiplier 74 receives REFCLK, which is then multiplied to generate an RF reference clock $RF_{REF}$. RF phase adjustment circuitry 76 receives $RF_{REF}$ and applies an adjustable phase-shift to create a phase-adjusted calibration signal, which then feeds a variable gain RF amplifier 78. The variable gain RF amplifier 78 applies an adjustable gain to create $RF_{CAL}$. An in-phase RF mixer amplifier 80 receives $RF_{REF}$ and then provides buffering to create $I_{RF}$. A 90-degree phase shifter 82 receives $RF_{REF}$ and applies a 90-degree phase-shift to create a 90-degree shifted local oscillator signal, which then feeds a quadrature-phase RF mixer amplifier 84. The quadrature-phase RF mixer amplifier 84 applies buffering to create $Q_{RF}$.

Figure 6:
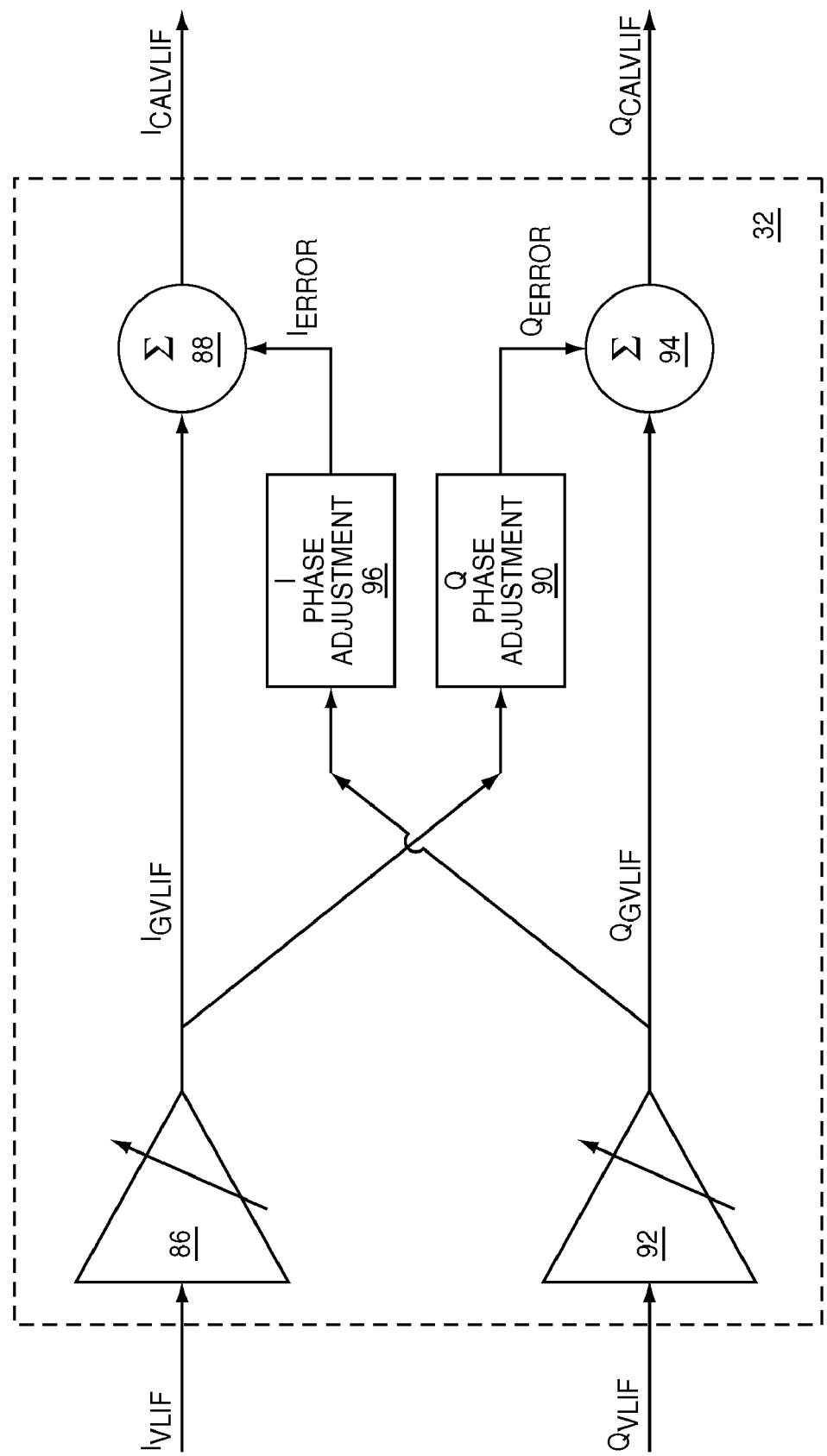
FIG. 6 shows details of the quadrature VLIF calibration circuitry of FIG. 2 in one embodiment of the present invention.

Details of the quadrature VLIF calibration circuitry 32 are shown in FIG. 6. An in-phase variable gain VLIF amplifier 86 receives $I_{VLIF}$ and applies an adjustable gain to create a gain-calibrated in-phase VLIF signal $I_{GVLIF}$, which then feeds an in-phase VLIF summing circuit 88 and a quadrature-phase phase adjustment circuit 90. A quadrature-phase variable gain VLIF amplifier 92 receives $Q_{VLIF}$ and applies an adjustable gain to create a gain-calibrated quadrature-phase VLIF signal $Q_{GVLIF}$, which then feeds a quadrature-phase VLIF summing circuit 94 and an in-phase phase adjustment circuit 96.

The quadrature-phase phase adjustment circuit 90 provides a phase adjustment to $Q_{GVLIF}$ by taking some in-phase signal, specifically $I_{GVLIF}$, to generate a quadrature-phase error signal $Q_{ERROR}$, which is then fed into the quadrature-phase VLIF summing circuit 94. The quadrature-phase VLIF summing circuit 94 phase calibrates the gain-calibrated quadrature-phase VLIF signal $Q_{GVLIF}$ by adding $Q_{GVLIF}$ to $Q_{ERROR}$ to create the calibrated quadrature-phase VLIF signal $Q_{CALVLIF}$.

The in-phase phase adjustment circuit 96 provides a phase adjustment to $I_{GVLIF}$, by taking some quadrature-phase signal, specifically $Q_{GVLIF}$, to generate an in-phase error signal $I_{ERROR}$, which is then fed into the in-phase VLIF summing circuit 88. The in-phase VLIF summing circuit 88 phase calibrates the gain-calibrated in-phase VLIF signal $I_{GVLIF}$ by adding $I_{GVLIF}$ to $I_{ERROR}$ to create the calibrated in-phase VLIF signal $I_{CALVLIF}$.

Figure 7:
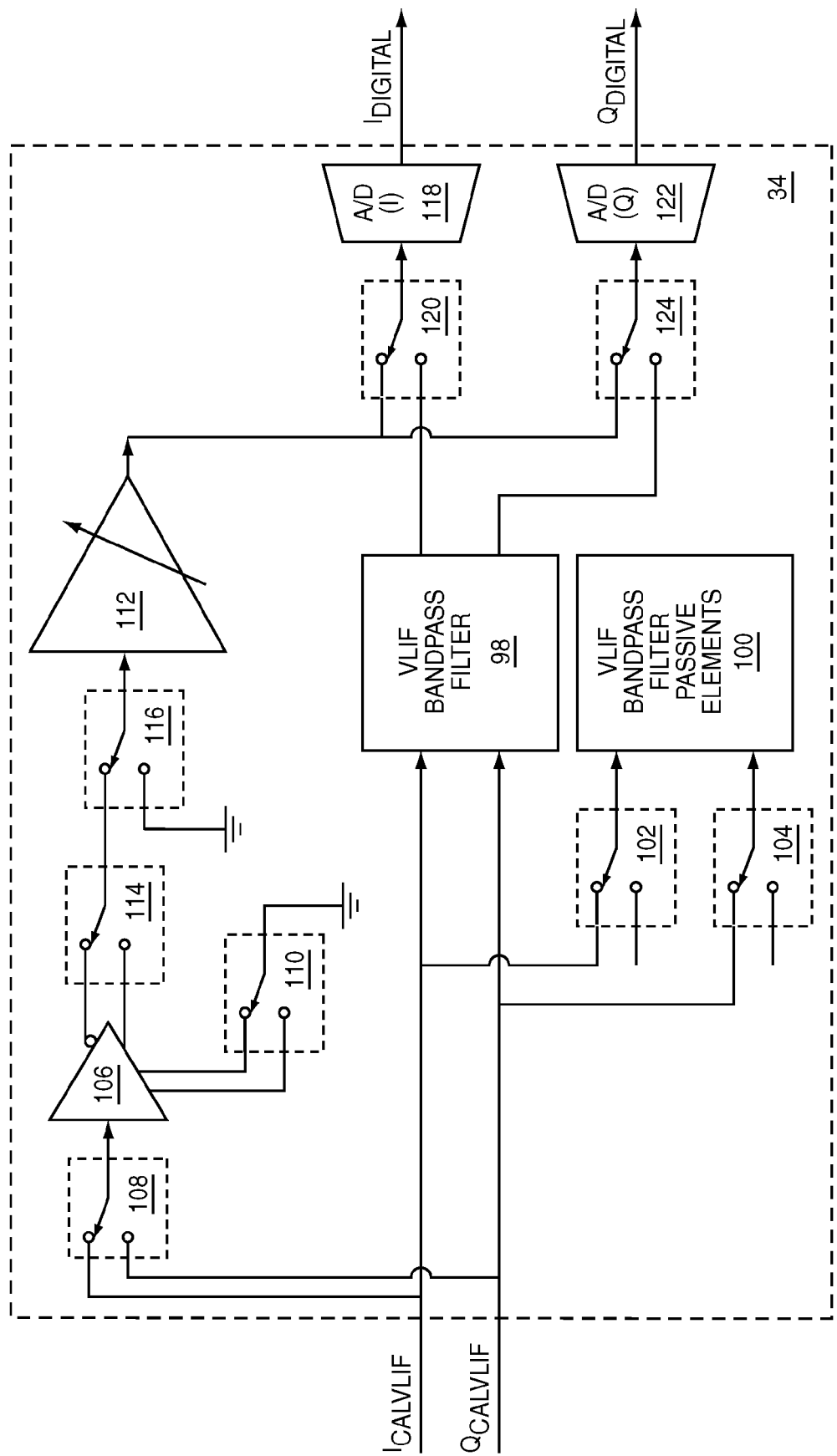
FIG. 7 shows details of the calibrated quadrature VLIF filtering, switching, and ND conversion circuitry of FIG. 2 in one embodiment of the present invention.

Details of the calibrated quadrature VLIF filtering, switching, and N D converter circuitry 34 are shown in FIG. 7. A VLIF bandpass filter 98 receives $I_{CALVLIF}$ and $Q_{CALVLIF}$. VLIF bandpass filter passive elements 100 are connected to $I_{CALVLIF}$ through a first VLIF switch 102 and to $Q_{CALVLIF}$ through a second VLIF switch 104. The first and second VLIF switches 102, 104 are used to disconnect the VLIF bandpass filter passive elements 100 during calibration to minimize calibration times.

An input to a first VLIF calibration amplifier 106 is connected to a third VLIF switch 108, which is connected to and used to select either $I_{CALVLIF}$ or $Q_{CALVLIF}$ during calibration. An amplifier gain switch 110 is used to select either a high gain or low gain setting for the first VLIF calibration amplifier 106. An input to a second VLIF calibration amplifier 112 is connected to a fourth VLIF switch 114 through a fifth VLIF switch 116. The fourth VLIF switch 114 is connected to and used to select either an inverting output or a non-inverting output from the first VLIF calibration amplifier 106 for peak-to-peak measurements. The fifth VLIF switch 116 is used to either ground the input to the second VLIF calibration amplifier 112 or to connect the input to an output from the first VLIF calibration amplifier 106. Peak-to-peak measurements may be made to minimize errors due to offsets, low frequency 1/f noise, and intermodulation effects.

$I_{DIGITAL}$ is provided from an output of an in-phase N D converter 118, which may have a resolution of + or −12 bits. An input of the in-phase N D converter 118 is connected to a sixth VLIF switch 120, which is connected to and selects either an in-phase output from the VLIF bandpass filter 98 or an output from the second VLIF calibration amplifier 112. $Q_{DIGITAL}$ is provided from an output of a quadrature-phase A/D converter 122, which may have a resolution of + or −12 bits. An input of the quadrature-phase A/D converter 122 is connected to a seventh VLIF switch 124, which is connected to and selects either a quadrature-phase output from the VLIF bandpass filter 98 or the output from the second VLIF calibration amplifier 112. All of the settings of the third, fourth, fifth, sixth, and seventh VLIF switches 108, 114, 116, 120, 124 and the amplifier gain switch 110 are used during calibration.

A calibration is performed after power-up of the calibrated quadrature VLIF receiver 24, called power-up calibration, and prior to packet reception on a specific receiver channel, called update calibration. A power-up calibration is performed for each received band with the RF frequency synthesizer and calibration signal generator 28 adjusted to each band's center frequency. Each update calibration is performed with the RF frequency synthesizer and calibration signal generator 28 adjusted to the frequency of the specific receiver channel. Power-up calibrations compensate for initial manufacturing and process tolerances. Update calibrations compensate for variations due to temperature, power supply, and specific channel frequency. One embodiment of the present invention, rejection of image frequencies may be at least 50 db, power-up calibrations may take less than 1 millisecond (mS) per frequency band, and update calibrations may take less than 90 microseconds (uS).

Figure 8:
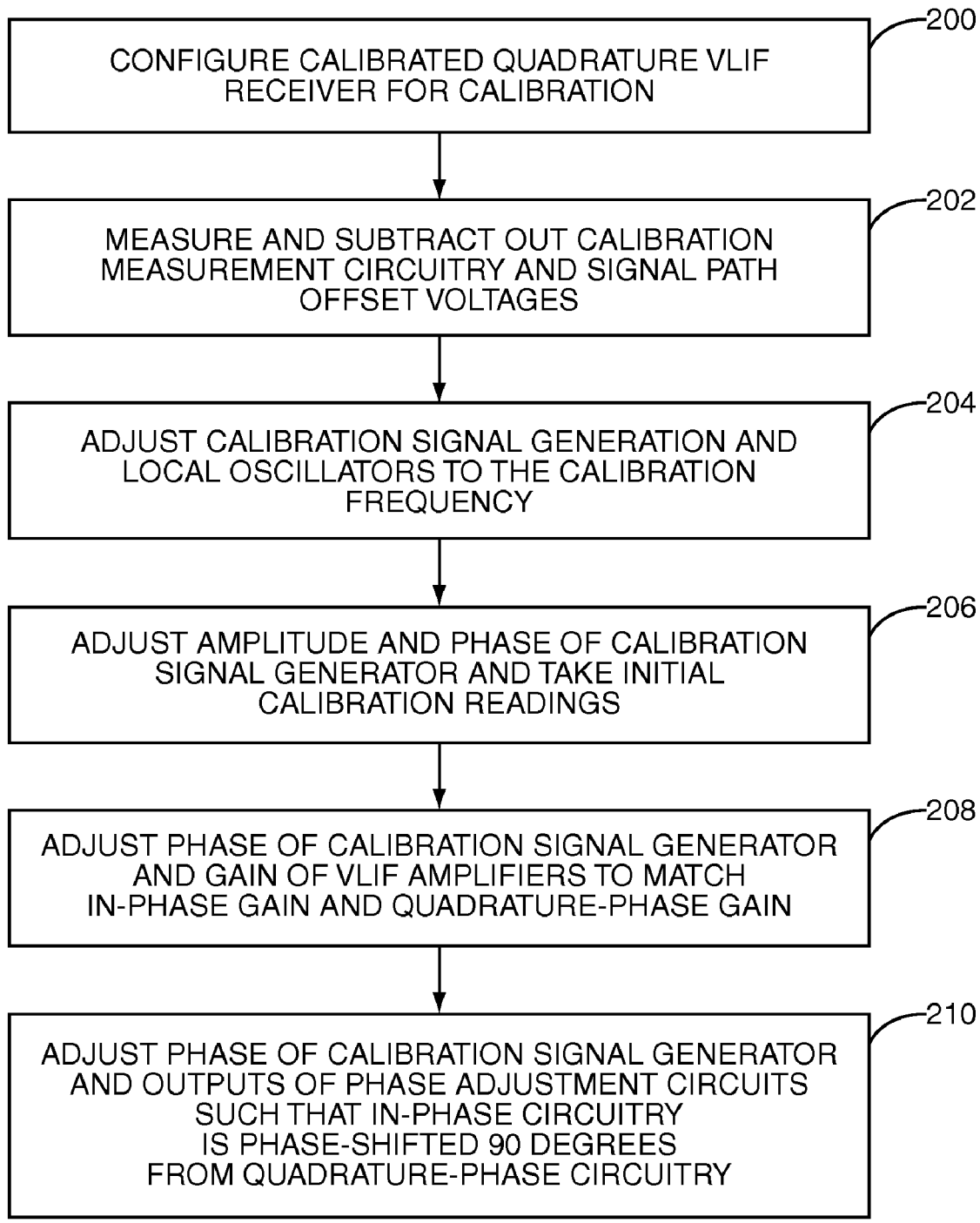
FIG. 8 shows the primary calibration steps 200 through 210.

The primary calibration process is shown for the second embodiment of the present invention in FIG. 8. The calibrated quadrature VLIF receiver 24 is configured for calibration (step 200). The calibration signal generator is adjusted for an output of essentially zero volts. Offset voltages of calibration measurement circuitry and signal path circuitry are measured and then subtracted-out in all subsequent calibration steps (step 202). Step 202 may be omitted for update calibrations. The calibration signal generator and local oscillators are adjusted such that the frequencies of $RF_{CAL}$, $I_{RF}$, and $Q_{RF}$ are all at a single appropriate calibration frequency (step 204). Step 204 may be performed during step 200 for update calibrations to minimize calibration times. The calibration signal generator is adjusted to establish initial calibration settings for $RF_{CAL}$ and to take initial calibration measurements (step 206). The calibration signal generator is adjusted to provide appropriate phase settings for $RF_{CAL}$, then the gain of the in-phase variable gain VLIF amplifier 86, the gain of the quadrature-phase variable gain VLIF amplifier 92, or both, is adjusted to match the amplitudes of in-phase VLIF circuitry with quadrature-phase VLIF circuitry (step 208). The calibration signal generator is adjusted to provide appropriate phase settings for $RF_{CAL}$, then the output of the in-phase phase adjustment circuit 96, the output of the quadrature-phase phase adjustment circuit 90, or both, is adjusted such that $I_{CALVLIF}$ is phase-shifted essentially 90 degrees from $Q_{CALVLIF}$ (step 210).

The sub-steps of each calibration step are provided below. Each sub-step applies to both power-up and update calibrations except where noted. Sub-steps correlating to steps 204 through 210 may be repeated for each RF band to be calibrated for power-up calibrations.

Figure 9:
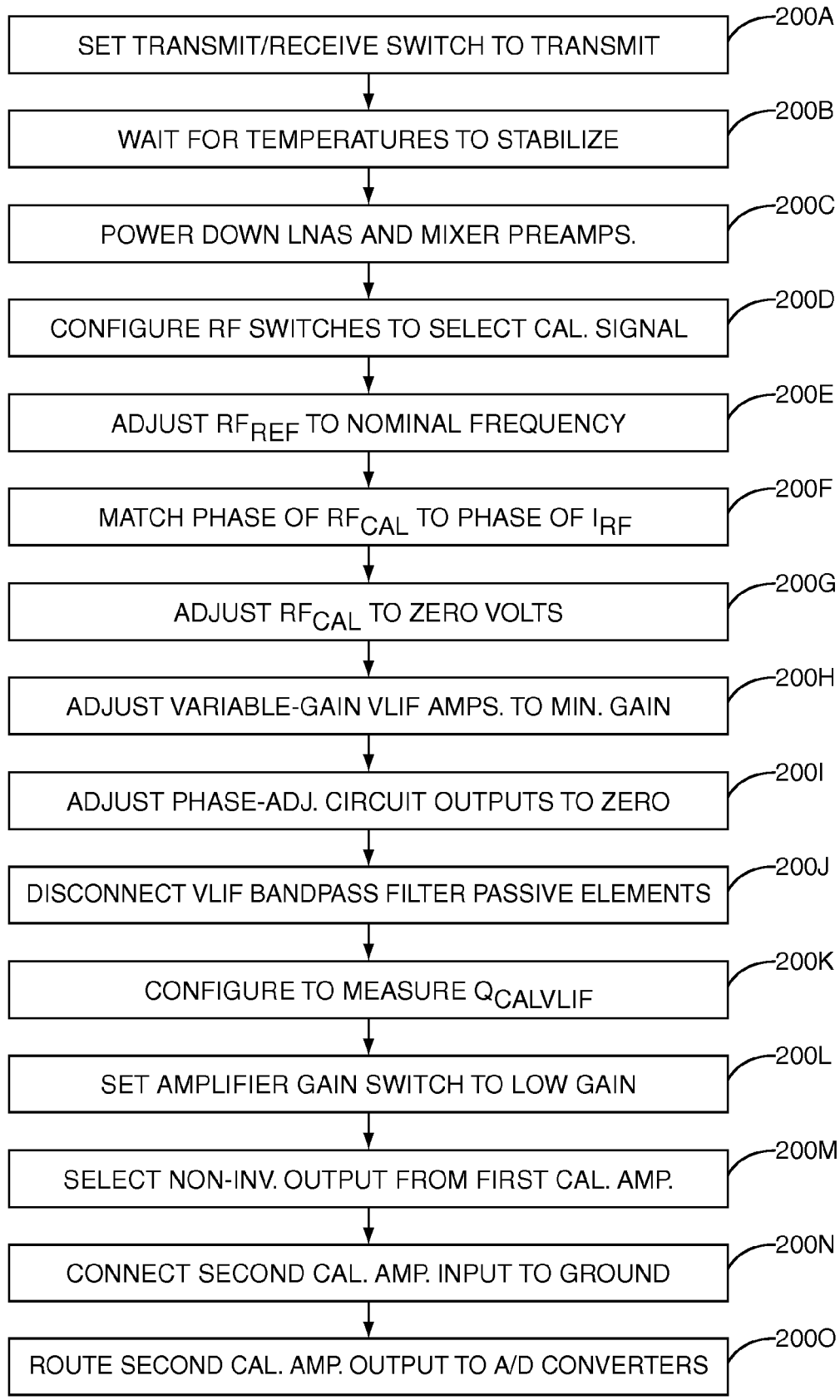
FIG. 9 shows the sub-steps of calibration step 200 of FIG. 8.

The sub-steps of step 200 for the second embodiment of the present invention are shown in FIG. 9. If upstream RF circuitry includes a transmit/receive switch (not shown), select the transmit position (step 200A). This minimizes interference from other RF circuitry. Wait for circuit temperatures to stabilize (step 200B). Step 200B may be omitted for update calibrations. Power down all RF LNAs 46, 48, 58, 60 and all RF mixer preamplifiers 52, 64 to minimize power consumption during calibration (step 200C). Configure the second, fourth, and fifth RF switches 54, 70, 72 to route $RF_{CAL}$ to $RF_{MIX}$, which feeds calibration signals to the calibrated quadrature VLIF mixer 30 (step 200D). Adjust the frequency multiplier 74 such that the frequency of $RF_{REF}$ is at a nominal operating frequency for power-up calibrations or at the receive channel frequency for update calibrations (step 200E). Adjust the RF phase adjustment circuitry 76 such that the phase of $RF_{CAL}$ is essentially equal to the phase of $I_{RF}$ (step 200F). Adjust the output of the variable gain RF amplifier 78 such that $RF_{CAL}$ is essentially zero volts (step 200G).

Adjust the gains of the variable gain VLIF amplifiers 86, 92 to their minimum values for power-up calibrations and to their last calibration value for update calibrations (step 200H). Adjust the outputs of the phase adjustment circuits 90, 96 to essentially zero (step 200I). Configure the first and second VLIF switches 102, 104 to disconnect the VLIF bandpass filter passive elements 100 from the VLIF bandpass filter 98, which minimizes calibration times (step 200J). Configure the third VLIF switch 108 to route $Q_{CALVLIF}$ to the input of the first VLIF calibration amplifier 106 (step 200K) in preparation for calibration measurements. Set the amplifier gain switch 110 to the low gain position (step 200L). Set the fourth VLIF switch 114 to select the non-inverting output from the first VLIF calibration amplifier 106 (step 200M). Configure the fifth VLIF switch 116 to ground the input to the second VLIF calibration amplifier 112 (step 200N). Step 200N is omitted for update calibrations. In this configuration, the output of the second VLIF calibration amplifier 112 will be its amplified offset voltage. Configure the sixth and seventh VLIF switches 120, 124 to route the output of the second VLIF calibration amplifier 112 to the A/D converters 118, 122 (step 200O) in preparation to measure offset voltages of calibration measurement circuitry.

Figure 10:
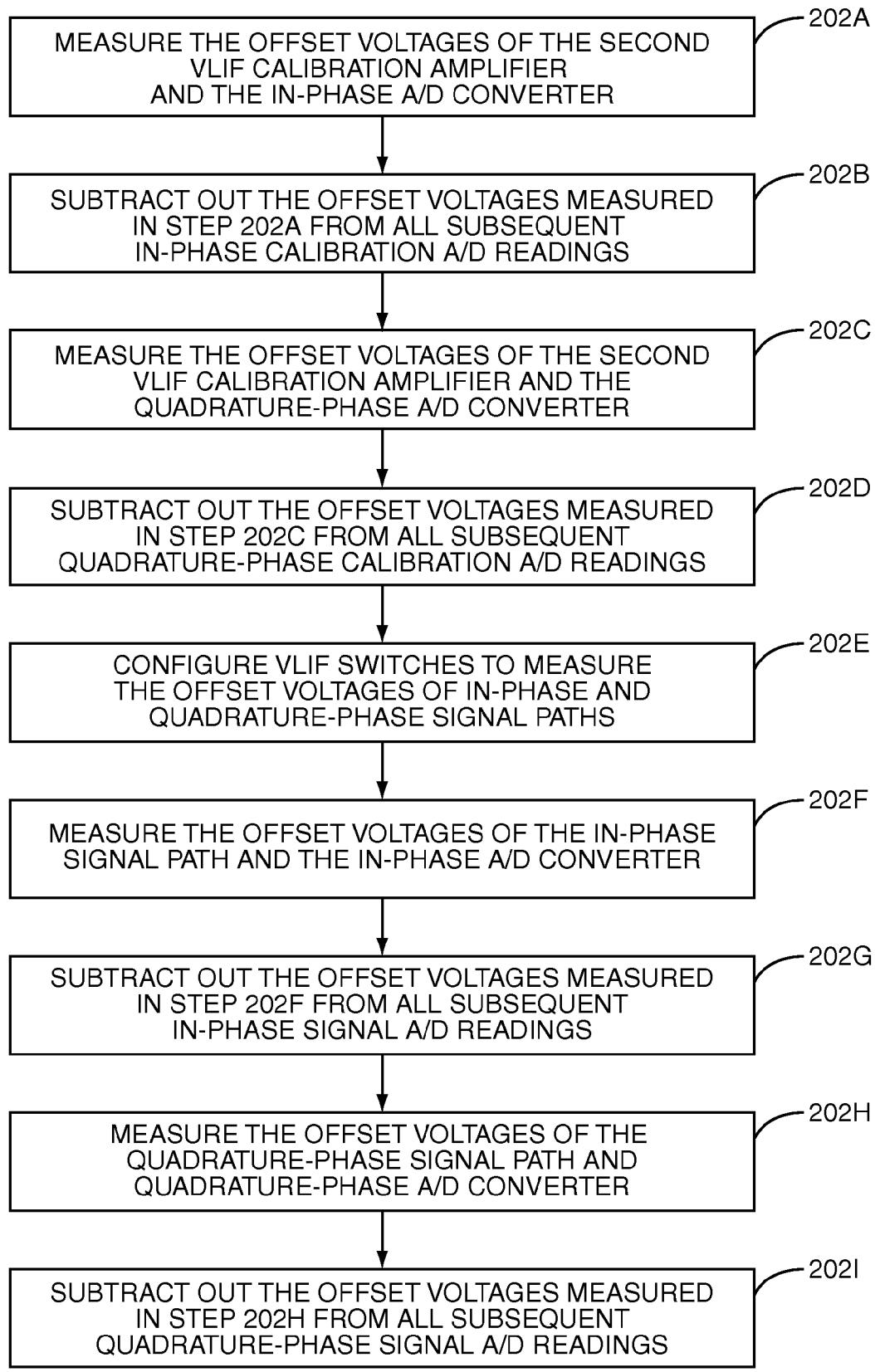
FIG. 10 shows the sub-steps of calibration step 202 of FIG. 8.

The sub-steps of step 202 for power-up calibrations for the second embodiment of the present invention are shown in FIG. 10. Measure the offset voltages from the second VLIF calibration amplifier 112 and the in-phase ND converter 118 by reading the value of $I_{DIGITAL}$ (step 202A). Subtract out the value of $I_{DIGITAL}$ measured in step 202A from all subsequent readings of $I_{DIGITAL}$ whenever the sixth and seventh VLIF switches 120, 124 are configured to route the output of the second VLIF calibration amplifier 112 to the in-phase ND converter 118 (step 202B). Measure the offset voltages from the second VLIF calibration amplifier 112 and the quadrature-phase ND converter 122 by reading the value of $Q_{DIGITAL}$ (step 202C). Subtract out the value of $Q_{DIGITAL}$ measured in step 202C from all subsequent readings of $Q_{DIGITAL}$ whenever the sixth and seventh VLIF switches 120, 124 are configured to route the output of the second VLIF calibration amplifier 112 to the quadrature-phase ND converter 122 (step 202D).

Configure the sixth and seventh VLIF switches 120, 124 to route the in-phase output from the VLIF bandpass filter 98 to the in-phase A/D converter 118 and the quadrature-phase output from the VLIF bandpass filter 98 to the quadrature-phase ND converter 122 in preparation to measure the signal path offset voltages (step 202E). Measure the offset voltage from the in-phase signal path by reading the value of $I_{DIGITAL}$ (step 202F). Subtract out the value of $I_{DIGITAL}$ measured in step 202F from all subsequent readings of $I_{DIGITAL}$ whenever the sixth VLIF switch 120 is configured to route the in-phase output from the VLIF bandpass filter 98 to the in-phase A/D converter 118 (step 202G). Measure the offset voltage from the quadrature-phase signal path by reading the value of $Q_{DIGITAL}$ (step 202H). Subtract out the value of $Q_{DIGITAL}$ measured in step 202H from all subsequent readings of $Q_{DIGITAL}$ whenever the seventh VLIF switch 124 is configured to route the quadrature-phase output from the VLIF bandpass filter 98 to the quadrature-phase ND converter 122 (step 202I). Other embodiments of the present invention may use a VLIF bandpass filter 98 with circuitry to null-out in-phase and quadrature-phase offset voltages. Such embodiments would replace steps 202F through 202I with other steps to adjust out the offset voltages.

Figure 11:
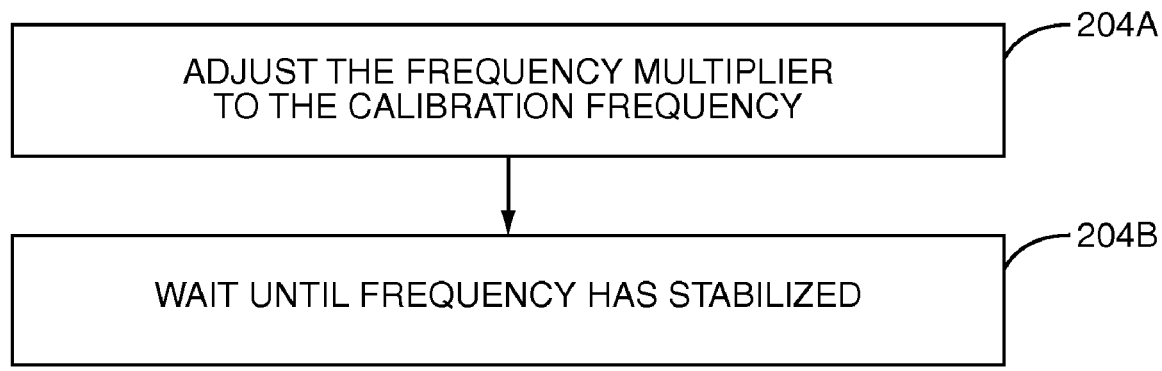
FIG. 11 shows the sub-steps of calibration step 204 of FIG. 8.

The sub-steps of step 204 for the second embodiment of the present invention are shown in FIG. 11. Adjust the frequency multiplier 74 such that the frequency of $RF_{REF}$ is at the center of the band being calibrated (step 204A). Step 204A may be omitted for update calibrations. Since the frequency multiplier 74 feeds the circuitry that provides $RF_{CAL}$, $I_{RF}$, and $Q_{RF}$, all three signals will be at the same operating frequency. Wait until the frequency multiplier 74 has stabilized, which may be within 0.01% of its final value (step 204B).

Figure 12:
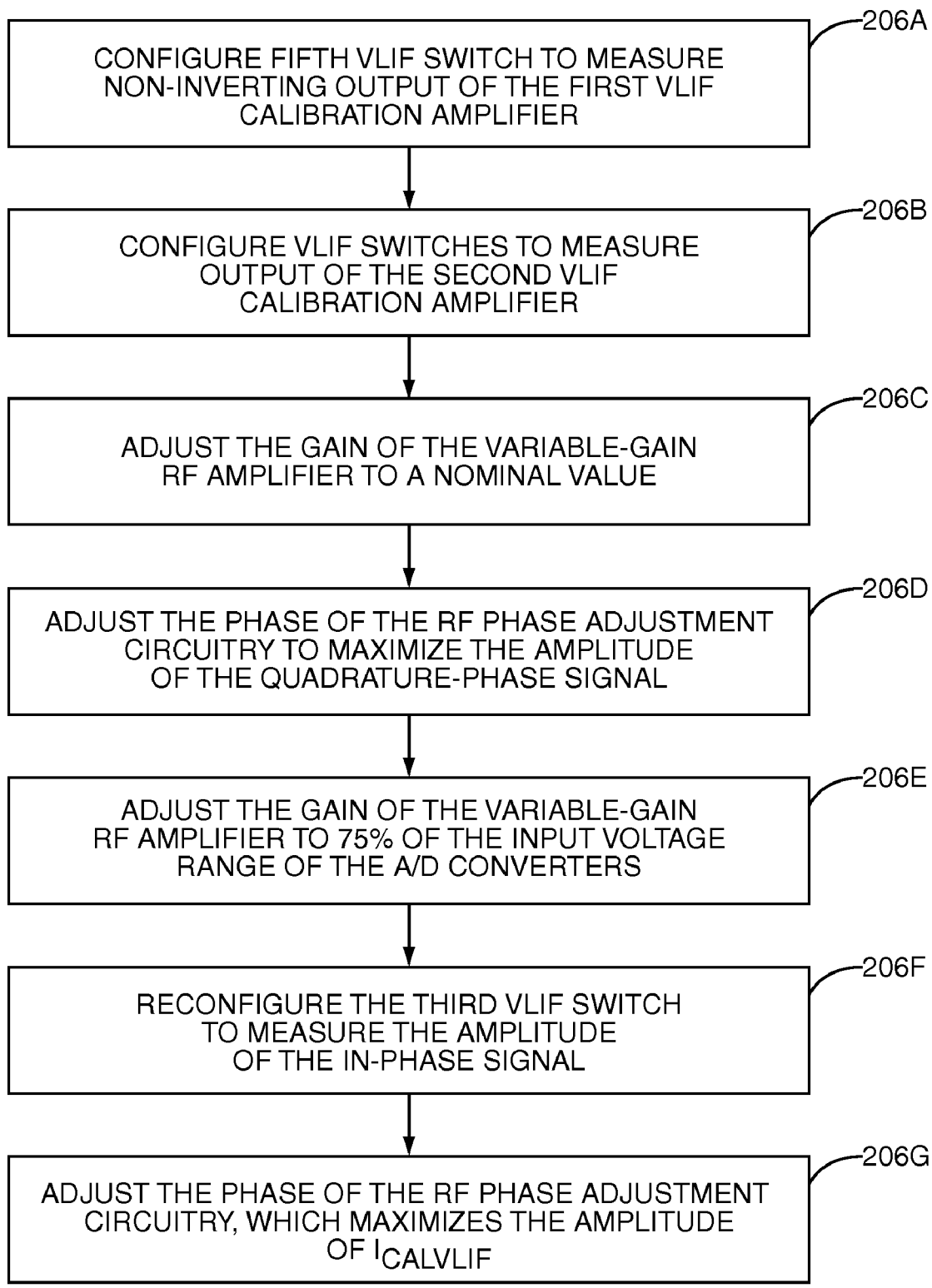
FIG. 12 shows the sub-steps of calibration step 206 of FIG. 8.

The sub-steps of step 206 for the second embodiment of the present invention are shown in FIG. 12. Configure the fifth VLIF switch 116 to route the non-inverting output from the first VLIF calibration amplifier 106 to the input of the second VLIF calibration amplifier 112 (step 206A) in preparation for calibration measurements. Configure the sixth and seventh VLIF switches 120, 124 to route the output of the second VLIF calibration amplifier 112 to the A/D converters 118, 122 (step 206B) in preparation for calibration measurements. Adjust the output of the variable gain RF amplifier 78 such that the amplitude of $RF_{CAL}$ is a nominal value for power-up calibrations and to the last calibration value for update calibrations (step 206C). Adjust the RF phase adjustment circuitry 76 such that the value of $(I_{DIGITAL}+Q_{DIGITAL})/2$ is maximized, which maximizes $Q_{CALVLIF}$ (step 206D). Adjust the output of the variable gain RF amplifier 78 such that the value of $(I_{DIGITAL}+Q_{DIGITAL})/2$ is equal to 75% of the full-scale value of the ND converters 118, 122 (step 206E). Reconfigure the third VLIF switch 108 to route $I_{CALVLIF}$ to the input of the first VLIF calibration amplifier 106 (step 206F) in preparation for calibration measurements. Adjust the RF phase adjustment circuitry 76 such that the value of $(I_{DIGITAL}+Q_{DIGITAL})/2$ is maximized, which maximizes $I_{CALVLIF}$ (step 206G).

Figure 13:
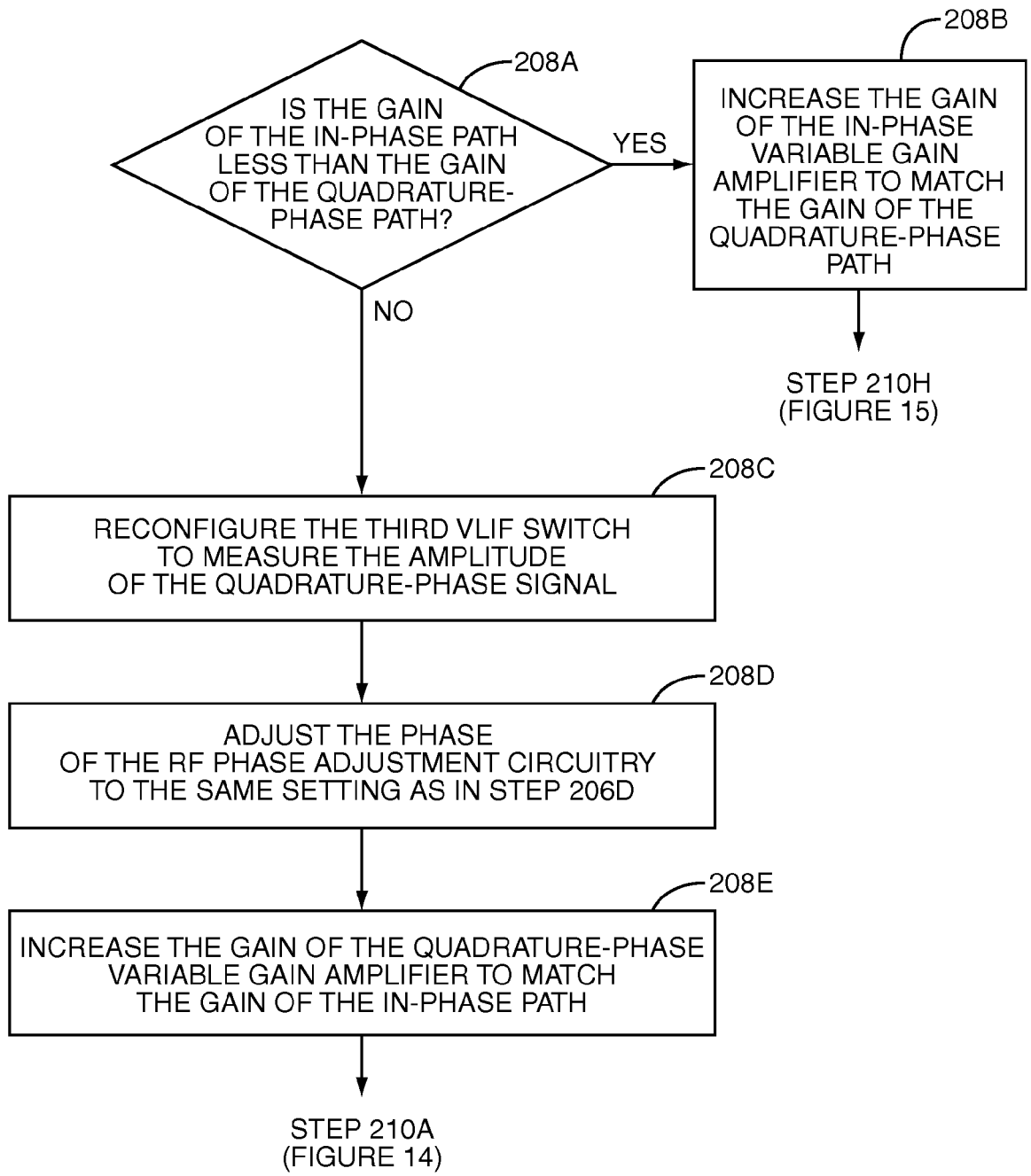
FIG. 13 shows the sub-steps of calibration step 208 of FIG. 8.

The sub-steps of step 208 for the second embodiment of the present invention are shown in FIG. 13. If the value of $(I_{DIGITAL}+Q_{DIGITAL})/2$ in step 206G, which is the maximum value of amplitude of $I_{CALVLIF}$, is less than the value of $(I_{DIGITAL}+Q_{DIGITAL})/2$ in step 206E, which is the maximum value of amplitude of $Q_{CALVLIF}$, then the gain of the in-phase path is less than the gain of the quadrature-phase path; therefore proceed to step 208B, otherwise proceed to step 208C (step 208A).

Step 208B proceeds as follows. Increase the gain of the in-phase variable gain VLIF amplifier 86 until the value of $(I_{DIGITAL}+Q_{DIGITAL})/2$ matches the value of $(I_{DIGITAL}+Q_{DIGITAL})/2$ in step 206E, which matches the gains of the in-phase path and the quadrature-phase path, then proceed to step 210H (FIG. 15).

Step 208C proceeds as follows. The maximum value of amplitude of $Q_{CALVLIF}$ is less than the maximum value of amplitude of $I_{CALVLIF}$; therefore, reconfigure the third VLIF switch 108 to route $Q_{CALVLIF}$ to the input of the first VLIF calibration amplifier 106 to prepare for calibration measurements (step 208C). Adjust the RF phase adjustment circuitry 76 to the same phase setting as in step 206D (step 208D). Increase the gain of the quadrature-phase variable gain VLIF amplifier 92 until the value of $(I_{DIGITAL}+Q_{DIGITAL})/2$ matches the value of $(I_{DIGITAL}+Q_{DIGITAL})/2$ in step 206G (step 208E). For update calibrations, it may be necessary to decrease the gain of one of the variable gain VLIF amplifiers 86, 92 if adjustment range limitations are exceeded. This completes the gain adjustment portion of the calibration.

Figure 14:
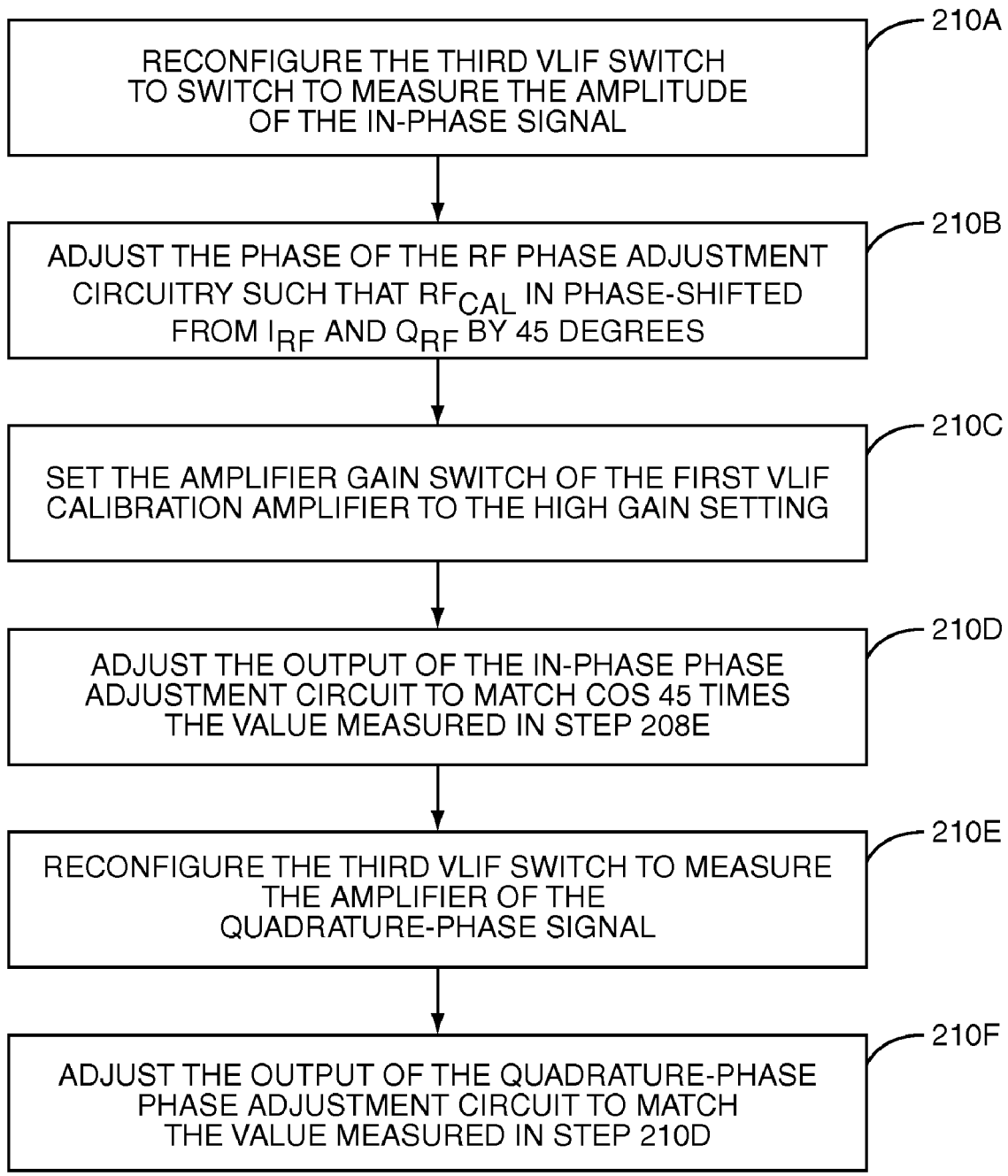
FIGS. 14 and 15 show the sub-steps of calibration step 210 of FIG. 8.
Figure 15:
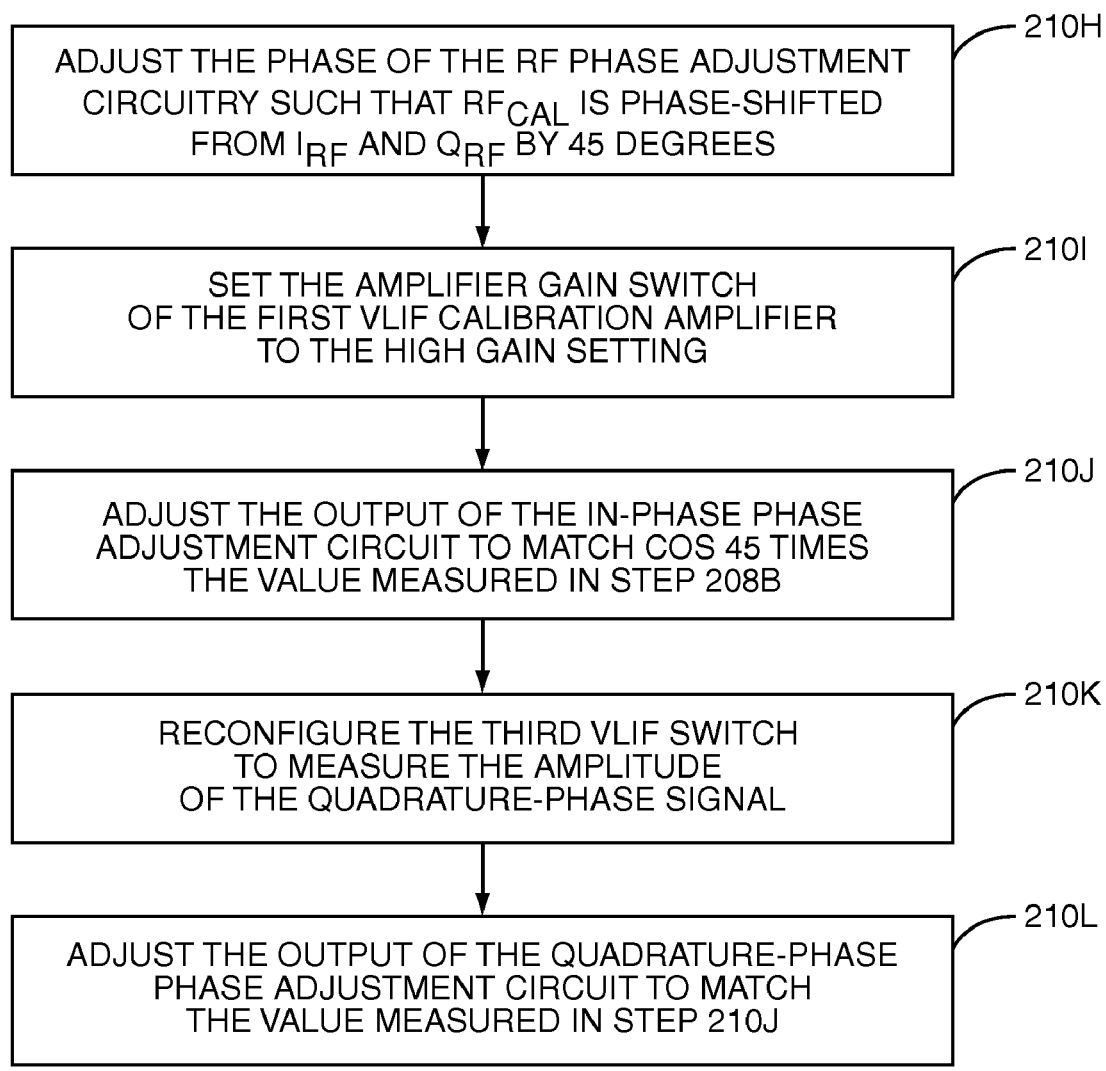

The sub-steps of step 210 for the second embodiment of the present invention are shown in FIGS. 14 and 15. Reconfigure the third VLIF switch 108 to route $I_{CALVLIF}$ to the input of the first VLIF calibration amplifier 106 in preparation to measure the amplitude of the in-phase signal (step 210A). Adjust the RF phase adjustment circuitry 76 such that $RF_{CAL}$ is phase-shifted from $I_{RF}$ and $Q_{RF}$ by essentially 45 degrees (step 210B). Set the amplifier gain switch 110 of the first VLIF calibration amplifier 106 to the high gain position (step 210C). Adjust the output of the in-phase phase adjustment circuit 96 until the value of $(I_{DIGITAL}+Q_{DIGITAL})/2$ is equal to the Cosine of 45 degrees times the value of $(I_{DIGITAL}+Q_{DIGITAL})/2$ in step 208E (step 210D). Reconfigure the third VLIF switch 108 to route $Q_{CALVLIF}$ to the input of the first VLIF calibration amplifier 106 in preparation to measure the amplitude of the quadrature-phase signal (step 210E). Adjust the output of the quadrature-phase phase adjustment circuit 90 until the value of $(I_{DIGITAL}+Q_{DIGITAL})/2$ is equal to the value of $(I_{DIGITAL}+Q_{DIGITAL})/2$ in step 210D (step 210F). This completes the phase adjustment portion of the calibration.

Do not perform steps H through K if steps C through F were already performed. Adjust the RF phase adjustment circuitry 76 such that $RF_{CAL}$ is phase-shifted from $I_{RF}$ and $Q_{RF}$ by essentially 45 degrees (step 210H). Set the amplifier gain switch 110 of the first VLIF calibration amplifier 106 to the high gain position (step 210I). Adjust the output of the in-phase phase adjustment circuit 96 until the value of $(I_{DIGITAL}+Q_{DIGITAL})/2$ is equal to the Cosine of 45 degrees times the value of $(I_{DIGITAL}+Q_{DIGITAL})/2$ in step 208B (step 210J). Reconfigure the third VLIF switch 108 to route $Q_{CALVLIF}$ to the input of the first VLIF calibration amplifier 106 in preparation to measure the amplitude of the quadrature-phase signal (step 210K). Adjust the output of the quadrature-phase phase adjustment circuit 90 until the value of $(I_{DIGITAL}+Q_{DIGITAL})/2$ is equal to the value of $(I_{DIGITAL}+Q_{DIGITAL})/2$ in step 210J (step 210L). This completes the phase adjustment portion of the calibration.

Some embodiments of the present invention may use mixer nonlinearity correction factors during calibration. Some embodiments of the present invention may take peak-to-peak measurements during calibration to maximize the resolution of ND converter readings. In the second embodiment of the present invention, peak-to-peak measurements are performed by reading values of $I_{DIGITAL}$ and $Q_{DIGITAL}$ with the non-inverting output of the first VLIF calibration amplifier 106 routed to the input of the second VLIF calibration amplifier 112, followed by reading values of $I_{DIGITAL}$ and $Q_{DIGITAL}$ with the inverting output of the first VLIF calibration amplifier 106 routed to the input of the second VLIF calibration amplifier 112, and then subtracting the two readings. Some embodiments of the present invention may use VLIF calibration amplifiers with two or more gain settings. Such embodiments may include calibration steps to calibrate the gain settings. Certain embodiments of the present invention may add look-up tables to compensate for minor phase errors in the RF calibration signal $RF_{CAL}$, particularly at the Cos 45 point.

Those skilled in the art will recognize improvements and modifications to the preferred embodiments of the present invention. All such improvements and modifications are considered within the scope of the concepts disclosed herein and the claims that follow.

What is claimed is:

1. A quadrature very low intermediate frequency (VLIF) receiver comprising:
    an in-phase local oscillator circuit adapted to provide an in-phase radio frequency (RF) local oscillator signal;
    a quadrature-phase local oscillator circuit adapted to provide a quadrature-phase RF local oscillator signal, wherein the quadrature-phase RF local oscillator signal is phase-shifted essentially 90 degrees from the in-phase RF local oscillator signal;
    calibration signal generator circuitry adapted to provide an RF calibration signal during calibration, wherein the in-phase RF local oscillator signal, the quadrature-phase RF local oscillator signal, and the RF calibration signal are at a first calibration frequency;

an in-phase VLIF mixer circuit adapted to receive the in-phase RF local oscillator signal and the RF calibration signal during calibration to generate an in-phase VLIF mixer calibration output signal;

a quadrature-phase VLIF mixer circuit adapted to receive the quadrature-phase RF local oscillator signal and the RF calibration signal during calibration to generate a quadrature-phase VLIF mixer calibration output signal; and calibration circuitry including an in-phase phase adjustment circuit; and a quadrature-phase phase adjustment circuit, the calibration circuitry adapted to receive during calibration:

the in-phase VLIF mixer calibration output signal to generate at least one in-phase calibration factor, wherein the at least one in-phase calibration factor further comprises an in-phase gain calibration factor and an in-phase phase calibration factor; and the quadrature-phase VLIF mixer calibration output signal to generate at least one quadrature-phase calibration factor, wherein the at least one quadrature-phase calibration factor further comprises a quadrature-phase gain calibration factor and a quadrature-phase phase calibration factor;

wherein at least one of the in-phase phase adjustment circuit and the quadrature-phase phase adjustment circuit is adjusted based on the in-phase phase calibration factor and the quadrature-phase phase calibration factor;

wherein the in-phase phase adjustment circuit further includes an in-phase summing circuit adapted to receive the in-phase VLIF mixer calibration output signal during calibration and the quadrature-phase VLIF mixer calibration output signal during calibration, and the in-phase phase adjustment circuitry is further adapted to add a portion of the quadrature-phase VLIF mixer calibration output signal to the in-phase VLIF mixer calibration output signal during calibration to generate a calibrated in-phase VLIF calibration output signal;

wherein the quadrature-phase phase adjustment circuit further comprises a quadrature-phase summing circuit adapted to receive the in-phase VLIF mixer calibration output signal during calibration and the quadrature-phase VLIF mixer calibration output signal during calibration; and wherein the quadrature-phase phase adjustment circuitry is further adapted to add a portion of the in-phase VLIF mixer calibration output signal to the quadrature-phase VLIF mixer calibration output signal during calibration to generate a calibrated quadrature-phase VLIF calibration output signal.

2. The quadrature VLIF receiver of claim 1, wherein:

the in-phase VLIF mixer circuit is further adapted to receive the in-phase RF local oscillator signal and an RF input signal during normal operation to generate an in-phase VLIF mixer output signal;

the quadrature-phase VLIF mixer circuit is further adapted to receive the quadrature-phase RF local oscillator signal and the RF input signal during normal operation to generate a quadrature-phase VLIF mixer output signal; and the calibration circuitry is further adapted:

to receive the in-phase VLIF mixer output signal during normal operation;

to receive the quadrature-phase VLIF mixer output signal during normal operation;

to apply the in-phase gain calibration factor and the in-phase phase calibration factor to the in-phase VLIF mixer output signal during normal operation to generate a calibrated in-phase VLIF output signal; and to apply the quadrature-phase gain calibration factor and the quadrature-phase phase calibration factor to the quadrature-phase VLIF mixer output signal during normal operation to generate a calibrated quadrature-phase VLIF output signal.

3. The quadrature VLIF receiver of claim 2, wherein:

an amplitude of the calibrated in-phase VLIF output signal is essentially equal to an amplitude of the calibrated quadrature-phase VLIF output signal; and the calibrated in-phase VLIF output signal is phase-shifted essentially 90 degrees from the calibrated quadrature-phase VLIF output signal.

4. The quadrature VLIF receiver of claim 1, wherein the calibration circuitry further comprises:

an in-phase variable gain VLIF amplifier;

a quadrature-phase variable gain VLIF amplifier; and wherein at least one of the in-phase variable gain VLIF amplifier and the quadrature-phase variable gain VLIF amplifier is gain adjusted based on the in-phase gain calibration factor and the quadrature-phase gain calibration factor.

5. The quadrature VLIF receiver of claim 1, further including a first RF frequency synthesizer circuit configured to generate the in-phase RF local oscillator signal, the quadrature-phase RF local oscillator signal, and the RF calibration signal.

6. The quadrature VLIF receiver of claim 1, further comprising passive components and switching circuitry, wherein during calibration the passive components are disconnected from other quadrature VLIF receiver circuitry.

7. The quadrature VLIF receiver of claim 1, wherein the quadrature VLIF receiver is adapted to determine the in-phase phase calibration factor, wherein the quadrature VLIF receiver is configured to adjust a phase of the RF calibration signal, wherein the RF calibration signal is:

phase-shifted essentially 45 degrees from the in-phase RF local oscillator signal; and phase-shifted essentially 45 degrees from the quadrature-phase RF local oscillator signal; and the quadrature VLIF receiver further adapted to measure the amplitude of the in-phase VLIF mixer calibration output signal; and the quadrature VLIF receiver further adapted to determine the quadrature-phase phase calibration factor, wherein the controller is adapted to adjust a phase of the RF calibration signal wherein the RF calibration signal is:

phase-shifted essentially 45 degrees from the in-phase RF local oscillator signal; and phase-shifted essentially 45 degrees from the quadrature-phase RF local oscillator signal; and the quadrature VLIF receiver further adapted to measure the amplitude of the quadrature-phase VLIF mixer calibration output signal.

* * * * *